US006957178B2

(12) United States Patent
Musliner et al.

(10) Patent No.: US 6,957,178 B2
(45) Date of Patent: Oct. 18, 2005

(54) INCREMENTAL AUTOMATA VERIFICATION

(75) Inventors: David J. Musliner, Plymouth, MN (US); Robert P. Goldman, Minneapolis, MN (US); Michael J. Pelican, Purcellville, VA (US)

(73) Assignee: Honeywell International Inc., Morristown, NJ (US)

( * ) Notice: Subject to any disclaimer, the term of this patent is extended or adjusted under 35 U.S.C. 154(b) by 786 days.

(21) Appl. No.: 10/015,058

(22) Filed: Oct. 29, 2001

(65) Prior Publication Data

US 2003/0083858 A1 May 1, 2003

(51) Int. Cl.⁷ .............................................. G06F 17/50
(52) U.S. Cl. .......................................... 703/15; 714/39
(58) Field of Search .............................. 703/2, 13, 15; 716/4, 6; 714/39

(56) References Cited

U.S. PATENT DOCUMENTS

| | | | |
|---|---|---|---|
| 4,571,072 A | 2/1986 | Bourbeau, Jr. et al. | |
| 4,711,024 A | 12/1987 | Russell | |
| 4,894,829 A | 1/1990 | Monie et al. | |
| 5,163,016 A | 11/1992 | Har'El et al. | |
| 5,291,427 A * | 3/1994 | Loyer et al. | 703/13 |
| 5,483,470 A * | 1/1996 | Alur et al. | 716/6 |
| 5,491,639 A | 2/1996 | Filkorn | |
| 5,659,484 A | 8/1997 | Bennett et al. | |
| 5,691,925 A | 11/1997 | Hardin et al. | |
| 5,815,717 A | 9/1998 | Stack | |
| 5,828,812 A | 10/1998 | Khan et al. | |
| 5,937,190 A | 8/1999 | Gregory et al. | |
| 5,966,516 A | 10/1999 | De Palma et al. | |
| 6,059,837 A | 5/2000 | Kukula et al. | |
| 6,077,305 A | 6/2000 | Cheng et al. | |
| 6,102,958 A | 8/2000 | Meystel et al. | |
| 6,102,959 A * | 8/2000 | Hardin et al. | 703/2 |
| 6,110,218 A | 8/2000 | Jennings | |
| 6,132,109 A | 10/2000 | Gregory et al. | |
| 6,141,633 A | 10/2000 | Iwashita et al. | |
| 6,499,132 B1 * | 12/2002 | Morley et al. | 716/5 |
| 6,526,544 B1 * | 2/2003 | Peled et al. | 716/4 |

OTHER PUBLICATIONS

R. Alur and D. Dill, "Automata-theoretic Verification of Real-Time Systems", Nov. 2, 1995, pp. 1-27.
M. Archer and C. Heirmeyer, "Mechanical Verification of Timed Automata: A Case Study", 1996, pp. 1-12.
R. Goering, "Design Automation: Breakthrough claimed in functional verification", EE Times, May 21, 2001, pp. 59-62.
F. Laroussinie et al., "From Timed Automata to Logic—and Back", BRICS—Jan. 1995, 22 pgs.
N. Lynch and F. Vaandrager, "Forward and Backward Simulations Part II: Timing-Based Systems", Apr. 26, 1995, pp. 1-49.
B. Plateau and W. Stewart, "Stochastic Automata Networks: Product Forms and Iterative Solutions", INRIA—1996, pp. 1-38.

* cited by examiner

Primary Examiner—Albert W. Paladini
(74) Attorney, Agent, or Firm—Thomas W. Leffert

(57) ABSTRACT

Methods and apparatus for performing formal verification of a system defined by a set of automata are useful in facilitating computing efficiencies during the verification of an incremental system design. The various embodiments permit computing efficiencies by saving information generated during a verification of the system for use in subsequent verification runs. The saved information includes calculation results pertaining to instances or elements of the system that do not require modification for the next subsequent verification.

20 Claims, 5 Drawing Sheets

INCREMENTAL AUTOMATA VERIFICATION

STATEMENT OF GOVERNMENT INTEREST

This invention was made with U.S. Government support under Contract F30602-00-C-0017 awarded by the U.S. Air Force. The U.S. Government has certain rights in this invention.

FIELD OF THE INVENTION

The present invention relates generally to formal verification of system behavior, and in particular to formal verification of system behavior involving incremental design changes.

BACKGROUND OF THE INVENTION

As control systems, scheduling systems, protocols and other real-time systems become increasingly complex, verification of their behavior prior to implementation and/or deployment becomes increasingly desirable. These large systems may be simulated using computer modeling techniques, but the complexity of the systems often precludes suitable simulation. An alternate approach becoming widely popular is that of formal verification.

Formal verification is a method of determining whether a system's constraints are met by the system design. Some formal verification systems, or more specifically, model-checking systems, compare logical definitions of constraints on a system's behavior with logical descriptions of the system to verify that the system's behavior will satisfy those constraints. Some of these checks are safety checks, e.g., determining whether a particular state, usually a failure state or other undesirable state, is reachable. Another example includes liveness checks to verify whether a system will get stuck in a "no-progress" cycle, e.g., verifying that an automaton does not repeatedly visit a state where it checks for received data without visiting a state where it transmits data. The logical description of the system may be used to calculate a set of behavior traces of the system, i.e., a set of all possible system behaviors. Those behavior traces are checked against the behavior specification. There are a variety of tools suitable for such formal verification, including HyTech, available through the University of California at Berkeley, Calif., USA; Kronos, available through Verimag, Gières, France; SPIN, available through Lucent Technologies Inc., Murray Hill, N.J., USA; and PVS, available through SRI International, Menlo Park, Calif., USA.

In practice, a system designer provides a logical definition of constraints on a system's behavior and a logical description of the system to the formal verification system. If the logical definition of the intended behavior implies the logical description of the system, the system is true to the intended behavior. If not, changes are made in the logical models and the system is re-verified. Formal verification is a heavy user of computation time. The complexity of the computations can grow exponentially with the complexity of the system being verified.

For the reasons stated above, and for other reasons stated below that will become apparent to those skilled in the art upon reading and understanding the present specification, there is a need in the art for enhancements to methods for formal verification of system designs.

SUMMARY

Methods and apparatus for performing formal verification of a system defined by a set of automata are described herein. The various embodiments permit computing efficiencies by saving information generated during a verification of the system for use in subsequent verification runs. The saved information includes calculation results pertaining to instances or elements of the system that do not require modification for the next subsequent verification. This facilitates incremental system design without the need to regenerate the full global verification solution.

For one embodiment, the invention provides a method of formal verification of a system design. The method includes verifying a first instance of the system design and saving verification data from the verification of the first instance of the system design. The verification data represents results of calculations used to verify the first instance of the system design. The method further includes modifying the system design, thereby generating a second instance of the system design. The method still further includes verifying the second instance of the system design using the saved verification data.

For another embodiment, the invention provides a method of formal verification of a system defined by a set of automata. The method includes performing a first verification of the system. The first verification includes generating a partial solution pertaining to a first portion of the set of automata and generating a partial solution pertaining to a second portion of the set of automata. The method further includes modifying the system by modifying one or more automata of the first portion of the set of automata without modifying any automaton of the second portion of the set of automata. The method still further includes performing a second verification of the system after modifying the system. The second verification includes generating a partial solution pertaining to the first portion of the set of automata and using the partial solution pertaining to the second portion of the set of automata generated from the first verification.

For still another embodiment, the invention provides a computer-usable medium having computer-readable instructions stored thereon. The computer-readable instructions are adapted to cause a processor to perform a method including verifying a first instance of the system design and saving verification data from the verification of the first instance of the system design. The verification data represents results of calculations used to verify the first instance of the system design. The method further includes adding one or more design elements to the first instance of the system design, thereby generating a second instance of the system design. The method still further includes verifying the second instance of the system design using the saved verification data.

Further embodiments of the invention include methods and apparatus of varying scope.

DETAILED DESCRIPTION

Figure 1:
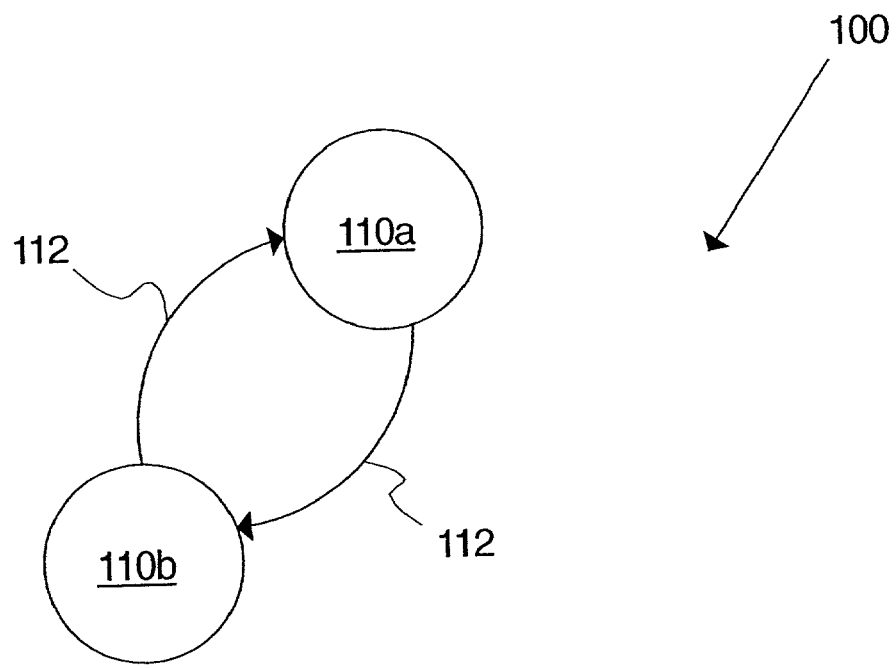
FIG. 1 is a state diagram of a system containing two automata.
Figure 1:
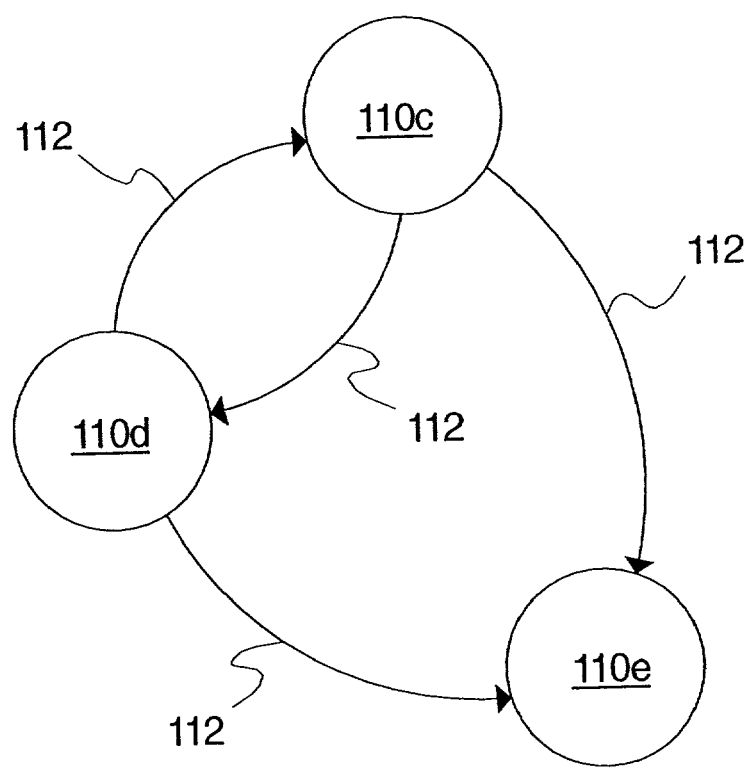

In the following detailed description of the present embodiments, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that process, electrical or mechanical changes may be made without departing from the scope of the present invention. The following detailed description is, therefore, not to be taken in a limiting sense, and the scope of the present invention is defined only by the appended claims and equivalents thereof.

Formal verification is well understood in the art. See, e.g., F. Laroussinie, et al., From Timed Automata to Logic—and Back, *Basic Research in Computer Science*, RS-95-2, January 1995; B. Plateau, et al., Stochastic Automata Networks: Product Forms and Iterative Solutions, *INRIA*, No. 2939, July 1996; U.S. Pat. No. 5,483,470, issued Jan. 9, 1996 to Alur et al.; and U.S. Pat. No. 5,163,016, issued Nov. 10, 1992 to Har'El et al. Accordingly, a detailed discussion of this technology will not be presented herein.

The methods of the various embodiments are generally applicable to design of systems that can be represented by automata. One example of the type of system that can be verified using the various embodiments is control systems, such as industrial control systems or flight management systems. Other examples include communication and synchronization protocols. Further examples include scheduling systems, e.g., processor, transportation and production scheduling systems. These systems are routinely characterized as timed automata. The timed automata have discrete states as well as timing constraints that describe how the system can move between states under the control of time. However, the various embodiments are also applicable to systems that can be defined using other types of automata, including, but not limited to, discrete finite state automata, linear hybrid automata and hybrid automata.

The verification systems may associate a matrix, i.e., a difference-bound matrix, with clock assignments within a system design. For timed automata, the matrix is an efficient representation that captures a large (possibly infinite) number of assignments of values to the clocks of a timed automaton. If a change is made to an automaton creating new transitions, this also leads to new clocks which leads to new dimensions of the matrix. To maintain the bit usage and to increase the probability that saved information will be reusable in subsequent verifications, it is preferred to oversize the matrix, providing "don't care" bits corresponding to not-yet-defined clocks, to allow the matrix dimensions to remain constant throughout the verification process.

Formal verification of a system is often repeated multiple times as a system design is refined or otherwise modified. Under current practice, each verification starts fresh, i.e., the calculations are repeated on the "new" system design. The various embodiments save information from a verification run to be used in a subsequent verification. The saved information includes execution traces, the set of paths that the system could follow. Where a partial solution is obtained to the global solution of the system, and a modification to the system does not affect the partial solution, this partial solution may be saved and used in subsequent verification runs. By avoiding the need to re-calculate this partial solution, valuable calculation time is saved.

A system, S, is generally defined by a product of its component processes or automata as:

$$S = A_1 \otimes A_2 \otimes A_3 \ldots \otimes A_n$$

where: each A is a component automaton of the system S.

As one example, the system may be a communication protocol modeled as:

$$S = IF_{Snd} \otimes P_{Snd} \otimes CH_{Snd} \otimes CH_{Rcv} \otimes P_{Rcv} \otimes IF_{Rcv}$$

where: $IF_{Snd}$ models the sender interface;

$P_{Snd}$ models the sender protocol;

$CH_{Snd}$ models the outgoing communication channel;

$CH_{Rcv}$ models the incoming communication channel;

$P_{Rcv}$ models the receiver protocol; and $IF_{Rcv}$ models the receiver interface.

FIG. 1 is a state diagram of a system 100 containing a set of two automata having states 10 and transitions 112 between states 110. A first automaton contains states 110a and 110b while a second automaton contains states 110c, 110d and 110e. Models for such systems are made up of a sequence of system states. For timed automata, each systems state is uniquely defined by a location and a clock-assignment. The location corresponds to a state 110 of an automaton while the clock-assignment keeps track of the temporal aspects of the system, thus governing the transitions 112.

Figure 2:
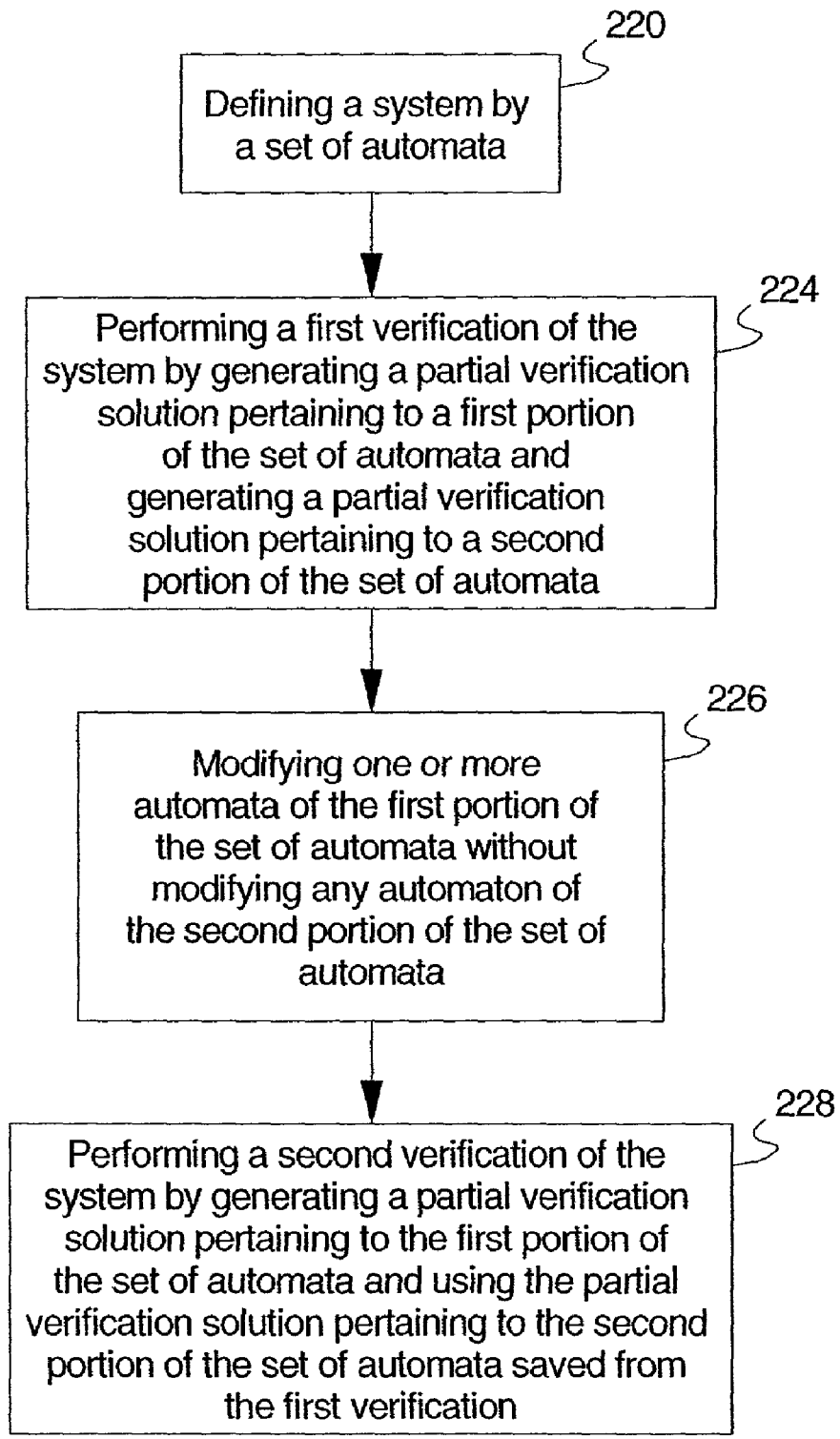
FIG. 2 is a flowchart of a method of formal verification of a system in accordance with an embodiment of the invention.

FIG. 2 is a flowchart of a method of formal verification of a system in accordance with an embodiment of the invention. At block 220 the system is defined by a set of automata. The set of automata contains a first portion having one or more automata and a second portion having one or more automata.

A first verification of the system is performed at block 224. The first verification is performed by generating a partial verification solution pertaining to a first portion of the set of automata and generating a partial solution pertaining to a second portion of the set of automata.

At block 226, the system is refined by modifying one or more automata of the first portion of the set of automata without modifying any automaton of the second portion of the set of automata. For this situation, the partial verification solution of the second portion of the set of automata may be saved and reused for subsequent verification runs.

A second verification of the system is then performed at block 228. The second verification is performed by generating a partial verification solution pertaining to the first portion of the set of automata, as modified at block 226, and using the partial verification solution pertaining to the second portion of the set of automata saved from the first verification.

Figure 3:
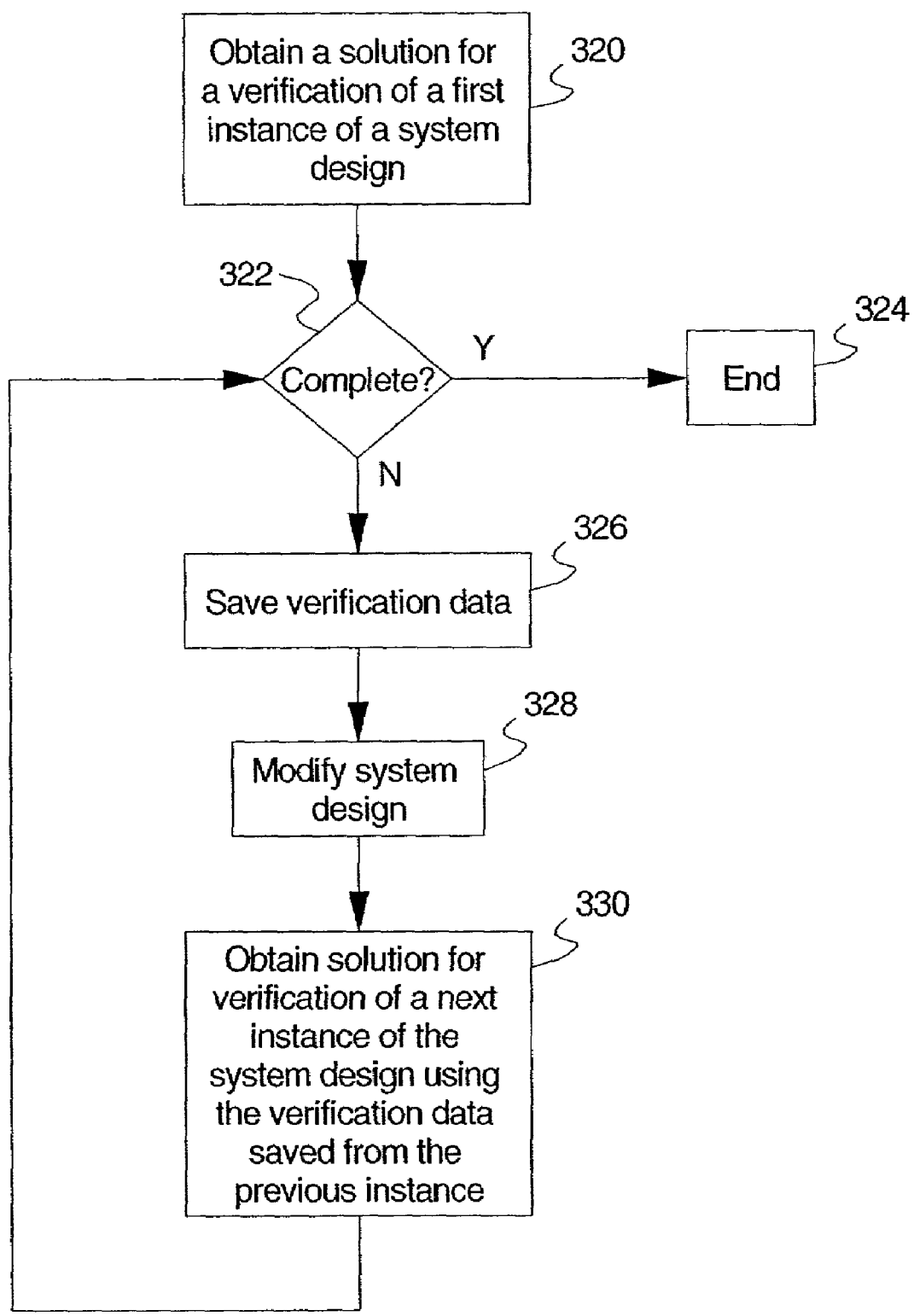
FIG. 3 is a flowchart of a method of formal verification of a system in accordance with another embodiment of the invention.

FIG. 3 is a flowchart of a method of formal verification of a system in accordance with another embodiment of the invention. At block 320, a verification of a first instance of a system design is performed to obtain a first solution. The first solution comprises verification data corresponding to the results of calculations pertaining to the verification, i.e., checking a model corresponding to the system design. At block 322, a decision is made whether the system design is complete. Such a decision is subjective to the system designer as guided by any constraints or design criteria defined for the system. If the design is determined to be complete at block 322, the process ends at block 324.

If the design is not determined to be complete at block 322, the verification data is saved at block 326 for the first or otherwise previous verification run. The system design is then modified at block 328. In refining, extending or otherwise modifying the system design, design elements are added to its corresponding model. This modification results in a second or next instance of the system design.

At block 330, a verification of next instance of a system design is performed to obtain a next solution. This verification utilizes the saved verification data from the previous verification, i.e., the verification performed on the previous instance of the system design, without a need to recalculate the results of the design elements of the model corresponding to the previous instance of the system design. In this manner, calculation efficiencies are achieved.

Figure 4:
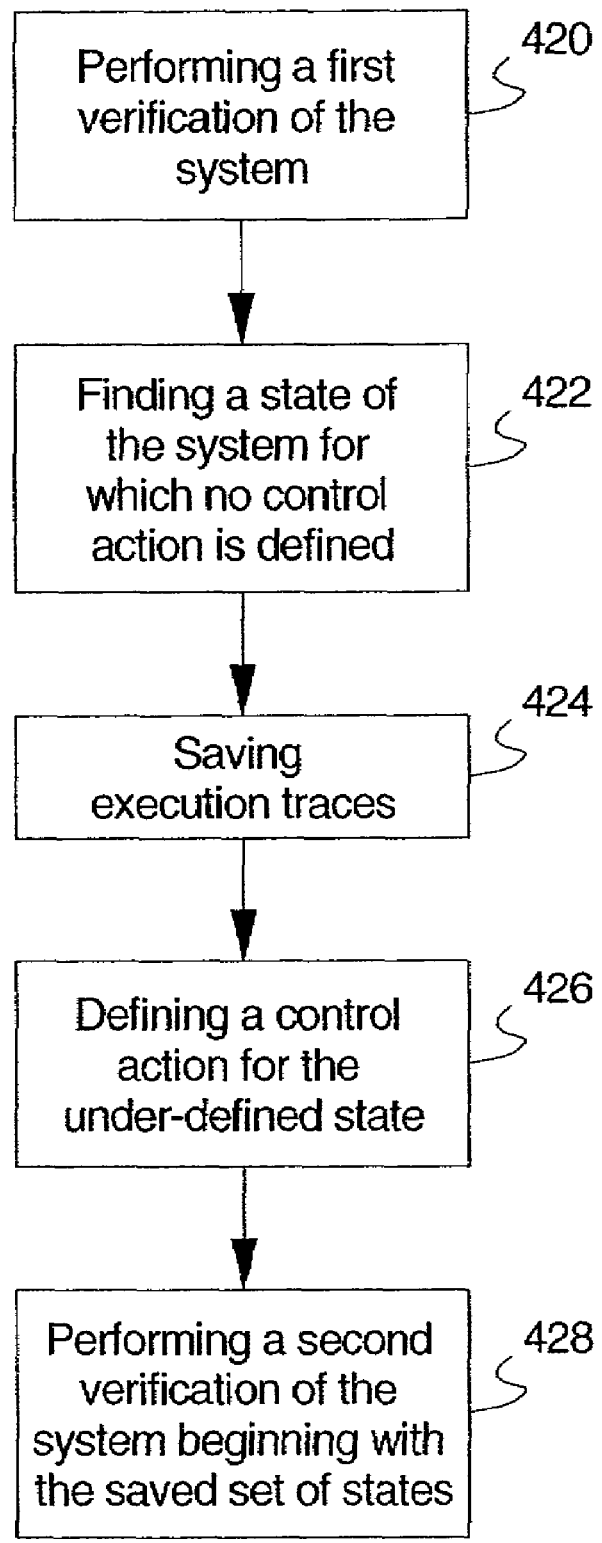
FIG. 4 is a flowchart of a method of formal verification of a system in accordance with a further embodiment of the invention.

FIG. 4 is a flowchart of a method of formal verification of a system in accordance with a further embodiment of the invention. At block 420, a verification of a first instance of a system design is performed. The verification includes a depth-first search through the state-space of the product automaton in order to find the execution traces. To a first approximation, the verification begins with the initial state of the product automaton and finds all the successor states. This process is repeated until the process finds a state already visited, finds a bad state or finds a state for which no control action has been defined. That a state has already been visited indicates that all of the states are good. Finding a bad state is indicative of a failed execution trace. If an unspecified or otherwise under-defined state is found at block 422, the set of states, and their execution traces, are saved.

In the process of computing successor state, difference-bound matrices are manipulated. These matrices, approximately one per state visited in the search, are generally saved as a result of saving the set of states. However, the focus is on saving the execution traces.

The under-defined state is then further specified at block 426, i.e., defining a control action for the state. A second verification of this new instance of the system is then performed at block 428 using the saved set of states and beginning the search for successor states from the newly specified state. Starting from the newly specified state is made possible because the paths leading up to this state were saved at block 424.

Figure 5:
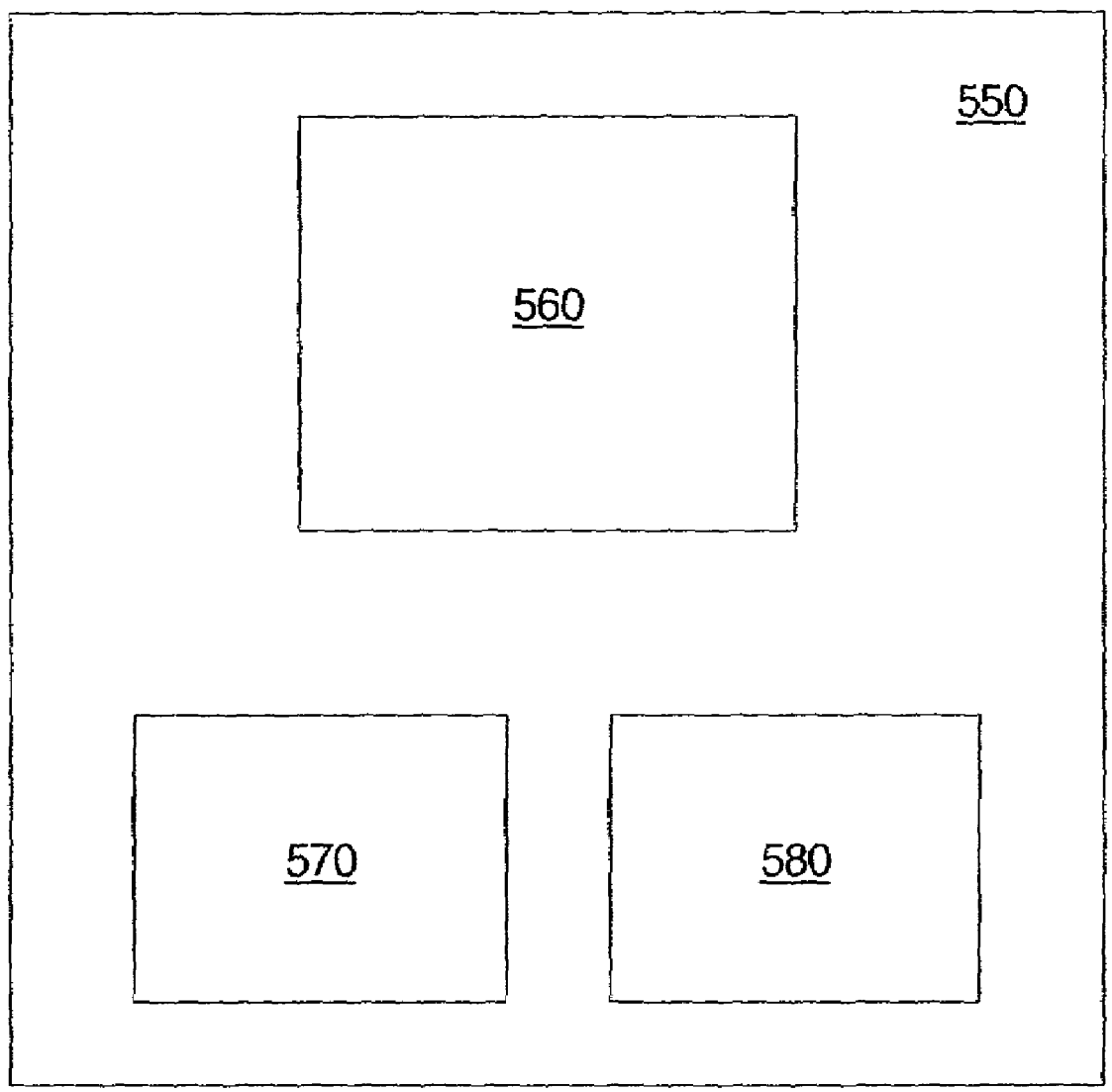
FIG. 5 is a block diagram of a computer system in accordance with an embodiment of the invention.

The methods of the various embodiments are suited for use in a computing environment. One example includes a mnicroprocessor-based computer system 550 as shown in FIG. 5. Computer system 550 has a user interface 560 for receiving input from a user of the computer system 550 and for providing output to the user. The computer system 550 further includes a processor 570 and a computer-usable medium 580 associated with the processor 570. The computer-usable medium can be any form of media capable of storing computer-readable instructions that are adapted to cause the processor 570 to perform a series of actions, computations and manipulations on various input received from the system user. Examples of computer-usable media include dynamic random access memory (DRAM), static random access memory (SRAM), read-only memory (ROM), electrically erasable programmable ROM (EEPROM or Flash Memory), magnetic media and optical media, whether removable or fixed. The computer-usable medium 580 may include one or more types of computer-usable media. The computer-usable medium 580 has computer-readable instructions stored thereon adapted to cause the processor 570 to perform a method in accordance with one or more embodiments of the invention.

CONCLUSION

Methods and apparatus for performing formal verification of a system defined by a set of automata have been described. The various embodiments permit computing efficiencies by saving information generated during a verification of the system for use in subsequent verification runs. The saved information includes calculation results pertaining to instances or elements of the system that do not require modification for the next subsequent verification. This facilitates incremental system design without the need to regenerate the full global verification solution.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of formal verification of a system design, wherein the system is defined by a set of automata, each having a set of states, the method comprising:
    performing a first verification of a system, beginning with an initial state and finding successor states;
    finding an under-defined state of the system;
    saving execution traces leading up to the under-defined state;
    further defining the under-defined state, thereby generating a newly specified state; and
    performing a second verification of the system beginning with the newly specified state, using the saved execution traces, and finding successor states.

2. The method of claim 1, wherein performing a verification of the system comprises conducting a depth-first search through a state-space of a product automaton of the system.

3. The method of claim 1, wherein the set of automata comprises more than one automaton.

4. The method of claim 1, wherein further defining the under-defined state comprises specifying a control action for the under-defined state.

5. A method of formal verification of a system design, wherein the system is defined by a set of automata, the method comprising:
    verifying a first instance of the system design;
    saving verification data from the verification of the first instance of the system design, wherein the verification data comprise results of calculations used to verify the first instance of the system design;
    modifying the system design, thereby generating a second instance of the system design; and
    verifying the second instance of the system design using the saved verification data.

6. The method of claim 5, wherein verifying a first instance of the system design comprises checking a logical model corresponding to the system design.

7. The method of claim 6, wherein modifying the system design further comprises adding a design element to the logical model.

8. The method of claim 7, wherein saving verification data comprises saving results from the checking of the logical model.

9. The method of claim 5, wherein saving verification data comprises saving a set of paths that the system can follow in the first instance of the system design.

10. A method of formal verification of a system defined by a set of automata, the method comprising:
performing a first verification of the system, wherein the first verification comprises generating a partial solution pertaining to a first portion of the set of automata and generating a partial solution pertaining to a second portion of the set of automata;
modifying the system, wherein modifying the system comprises modifying one or more automata of the first portion of the set of automata without modifying any automaton of the second portion of the set of automata; and
performing a second verification of the system after modifying the system, wherein the second verification comprises generating a partial solution pertaining to the first portion of the set of automata and using the partial solution pertaining to the second portion of the set of automata generated from the first verification.

11. The method of claim 10, wherein performing the first verification further comprises generating a partial solution pertaining to a third portion of the set of automata.

12. The method of claim 11, wherein modifying the system further comprises modifying one or more automata of the third portion of the set of automata and wherein performing the second verification further comprises generating a partial solution pertaining to the third portion of the set of automata.

13. The method of claim 11, wherein modifying the system further comprises modifying one or more automata of the first portion of the set of automata without modifying any automaton of the third portion of the set of automata and wherein performing the second verification further comprises using the partial solution pertaining to the third portion of the set of automata generated from the first verification.

14. The method of claim 10, wherein modifying an automaton comprises further specifying an under-defined state of that automaton.

15. A computer-usable medium having computer-readable instructions stored thereon adapted to cause a processor to perform a method, the method comprising:
performing a first verification of a system, beginning with an initial state and finding successor states;
finding an under-defined state of the system;
saving execution traces leading up to the under-defined state;
further defining the under-defined state, thereby generating a newly specified state; and
performing a second verification of the system beginning with the newly specified state, using the saved execution traces, and finding successor states.

16. The computer-usable medium of claim 15, wherein performing a verification of the system comprises conducting a depth-first search through a state-space of a product automaton of the system.

17. The computer-usable medium of claim 15, wherein the set of automata comprises more than one automaton.

18. The computer-usable medium of claim 15, wherein further defining the under-defined state comprises specifying a control action for the under-defined state.

19. A computer-usable medium having computer-readable instructions stored thereon adapted to cause a processor to perform a method, the method comprising:
verifying a first instance of the system design;
saving verification data from the verification of the first instance of the system design, wherein the verification data comprise results of calculations used to verify the first instance of the system design;
modifying the system design, thereby generating a second instance of the system design; and
verifying the second instance of the system design using the saved verification data.

20. A computer-usable medium having computer-readable instructions stored thereon adapted to cause a processor to perform a method, the method comprising:
performing a first verification of a system defined by a set of automata, wherein the first verification comprises generating a partial solution pertaining to a first portion of the set of automata and generating a partial solution pertaining to a second portion of the set of automata;
determining that one or more automata of the first portion of the set of automata have been modified without modifying any automaton of the second portion of the set of automata; and
performing a second verification of the system, wherein the second verification comprises generating a partial solution pertaining to the first portion of the set of automata and using the partial solution pertaining to the second portion of the set of automata generated from the first verification.

* * * * *